United States Patent [19]
Chien et al.

[11] Patent Number: 5,413,945
[45] Date of Patent: May 9, 1995

[54] BLANKET N-LDD IMPLANTATION FOR SUB-MICRON MOS DEVICE MANUFACTURING

[75] Inventors: Sun-Chieh Chien; Tzong-Shien Wu, both of Hsin-Chu, Taiwan, Prov. of China

[73] Assignee: United Micro Electronics Corporation, Hsinchu, Taiwan, Prov. of China

[21] Appl. No.: 289,671

[22] Filed: Aug. 12, 1994

[51] Int. Cl.$^6$ .......................................... H01L 21/336
[52] U.S. Cl. ...................................... 437/35; 437/34; 437/44; 437/57
[58] Field of Search ...................... 437/34, 35, 41, 44, 437/57

[56] References Cited

U.S. PATENT DOCUMENTS

| | | | |
|---|---|---|---|
| 4,599,789 | 7/1986 | Gasner | 437/57 |
| 4,771,014 | 9/1988 | Liou | 437/44 |
| 4,908,327 | 3/1990 | Chapman | 437/44 |
| 4,943,537 | 7/1990 | Harrington, III | 437/44 |
| 5,073,514 | 12/1991 | Ito et al. | 437/44 |
| 5,147,811 | 9/1992 | Sakagami | 437/35 |
| 5,177,030 | 1/1993 | Lee et al. | 437/47 |
| 5,212,542 | 5/1993 | Okumura | 257/369 |
| 5,217,910 | 6/1993 | Shimizu et al. | 437/35 |
| 5,221,630 | 6/1993 | Koyama et al. | 437/35 |

FOREIGN PATENT DOCUMENTS 3-108727  5/1991  Japan .................................. 437/35

OTHER PUBLICATIONS

"VLSI Technology", by S. M. Sze, published by McGraw-Hill International Signapore, 1988, pp. 482-483.

*Primary Examiner*—Mary Wilczewski
*Attorney, Agent, or Firm*—George O. Saile; Stephen B. Ackerman

[57] ABSTRACT

A method for making sub-micron MOS (Metal Oxide Semiconductor) devices, which do not suffer from hot carrier effect, and having improved short-channel effect and improved performance, is described. A silicon substrate with field isolation regions, P-well and N-well regions, and an oxide layer over the P-well and N-well regions is provided. The P-well region is implanted, in a substantially vertical direction, with a first conductivity-imparting dopant. Gate structures are formed over the P-well and N-well regions. A second conductivity-imparting dopant is implanted, at a large angle to the plane of the silicon substrate, that is of opposite conductivity to the first conductivity-imparting dopant, into the P-well and N-well regions, masked by the gate structures. The N-well region is implanted, in a substantially vertical direction, with a third conductivity-imparting dopant, of the same conductivity as the first conductivity-imparting dopant. Sidewall spacers are formed on the gate structures. The P-well region is implanted, in a substantially vertical direction, with a fourth conductivity-imparting dopant, of the same conductivity as the second conductivity-imparting dopant. The N-well region is implanted, in a substantially vertical direction, with a fifth conductivity-imparting dopant, of the same conductivity as the first conductivity-imparting dopant. The silicon substrate is heated to drive in the dopants.

18 Claims, 4 Drawing Sheets

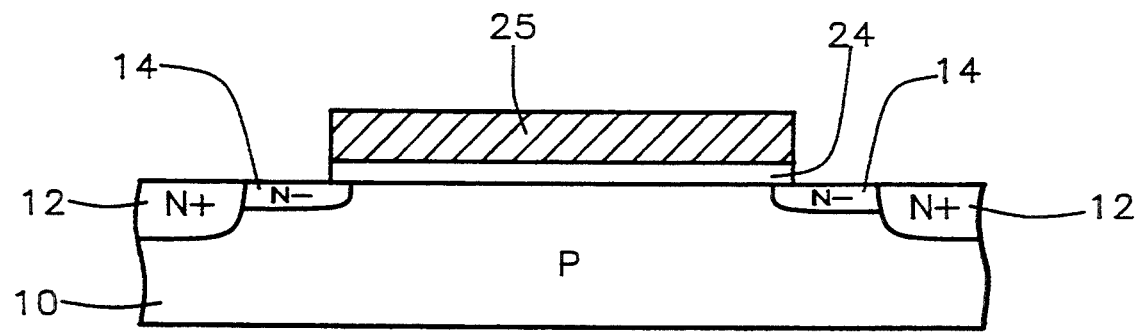
FIG. 1 – Prior Art
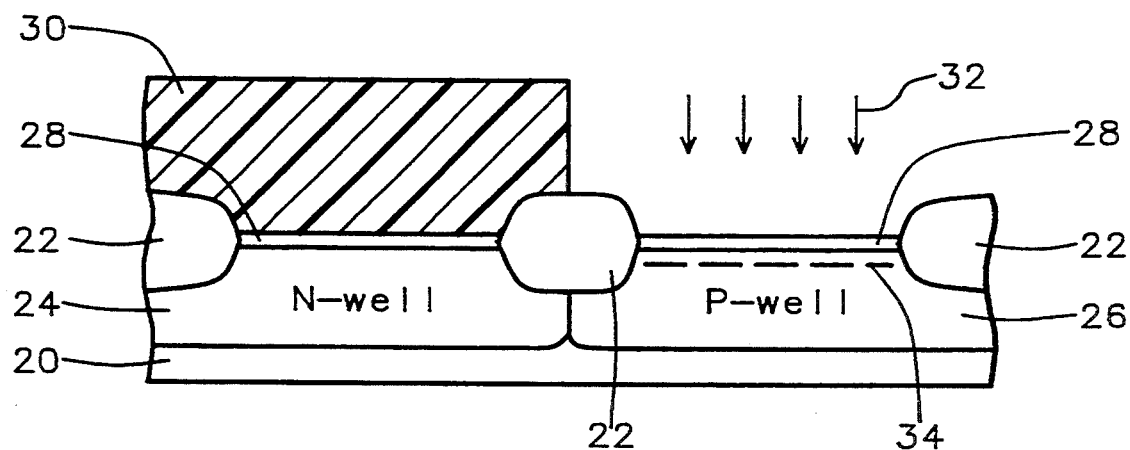
FIG. 2
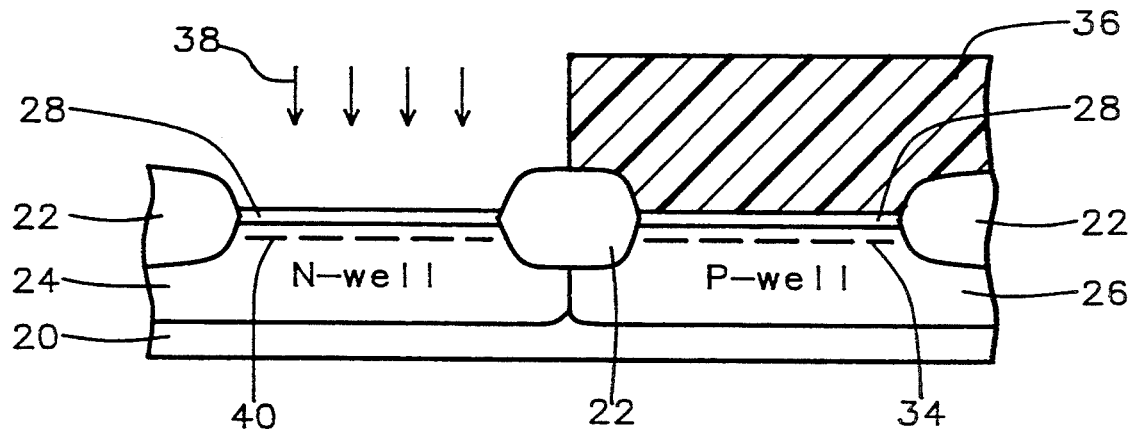
FIG. 3

BLANKET N-LDD IMPLANTATION FOR SUB-MICRON MOS DEVICE MANUFACTURING

BACKGROUND OF THE INVENTION

1. Field of the Invention

The invention relates to the manufacture of highly dense integrated circuits and more particularly to a very manufacturable method for making sub-micron MOS (Metal Oxide Semiconductor) devices.

2. Description of the Related Art

In the manufacture of highly dense integrated circuits using Metal Oxide Semiconductor Field Effect Transistors (MOSFET) technology, as device dimensions decrease, there has been a need to create shallower source/drain regions. However, corresponding high doping concentrations lead to an increase in the electric field in the device channel in the region adjacent to the drain. This high electric field causes electrons in the device channel to gain energy and be injected into the gate oxide. This phenomenon is known as the "hot carrier" problem, which leads to long-term device degradation and reduced reliability.

A second problem with highly dense MOS devices, particularly P-channel MOS (PMOS) structures with sub-micron feature sizes, is the so-called "short channel effect". Since the ions, typically boron B11 or boron fluoride $BF_2$, that are used to form the source and drain regions have a higher diffusion coefficient than the arsenic or phosphorus ions used to form the N-channel MOS (NMOS) source/drain regions, the effective channel length of the PMOS device will be less than that of an NMOS device formed on the same substrate.

Workers in the art are familiar with these problems and have attempted to overcome them. A method to reduce the high electric field at the drain region is to provide a more gradual, or graded, change in the doping concentration at the drain/channel interface. One means of accomplishing this is with a lightly doped drain (LDD), as described in "VLSI TECHNOLOGY", by S. M. Sze, published by McGraw-Hill International-Singapore, 1988, pages 482–483. As shown in FIG. 1, a substrate 10 is implanted with a heavy implant to create regions 12, and an implant with lighter doping concentration to form regions 14. Also shown are gate 25 which is separated from the device channel by gate oxide 24. A smaller electric field results at the drain/channel interface than would exist in a device in which a single heavy implant was performed, due to a reduction in the difference in dopant concentrations between the channel and the drain region adjacent to it. This may also be accomplished by a LATID (Large Angle Tilt Implanted Drain), in which, before spacer formation, a long N− region is formed by ion implanting while tilting the wafer with respect to the implant. A smaller electric field results at the drain/channel interface than in the LDD structure. Also, because the maximum point of the lateral electric field at the drain edge is not at the main path of channel current, the degradation caused by the hot-carrier effect is reduced.

The short-channel effect may also be overcome using a Halo structure. After poly gate formation, source/drain extensions are formed which are self-aligned to the poly gate edge and are composed of a lightly doped shallow region (LDD) and a deeper oppositely-doped pocket or "halo". The Halo structure can be formed by a LATID or double-implant LDD technique. This structure serves to increase the punchthrough voltage of the device and decrease the short channel threshold voltage falloff, because the influence of the drain electric field is confined by the oppositely-doped Halo. This structure also provides increased device performance because it allows use of a low impurity concentration in the substrate and in the channel region, to attain high carrier velocity.

An anti-punchthrough implantation is needed in the formation of submicron MOS devices because the well concentration is too light to prevent device punchthrough and the short-channel effect.

Therefore, in the formation of a sub-micron integrated circuit with both PMOS and NMOS devices, there are two masking steps and two implantation steps for each of the anti-punchthrough implant, the LDD formation, and the source/drain formation.

SUMMARY OF THE INVENTION

It is therefore a principal object of this invention to provide a very manufacturable method for making sub-micron MOS (Metal Oxide Semiconductor) devices.

It is a further object of the invention to provide a method of making sub-micron NMOS devices which do not suffer from hot carrier effect, and to make sub-micron PMOS devices with improved short-channel effect and improved performance.

This object is achieved by a method of forming MOS devices in which a silicon substrate with field isolation regions, P-well and N-well regions, and an oxide layer over the P-well and N-well regions is provided. The P-well region is implanted, in a substantially vertical direction, with a first conductivity-imparting dopant. Gate structures are formed over the P-well and N-well regions. A second conductivity-imparting dopant is implanted, at a large angle to the plane of the silicon substrate, that is of opposite conductivity to the first conductivity-imparting dopant, into the P-well and N-well regions, masked by the gate structures. The N-well region is implanted, in a substantially vertical direction, with a third conductivity-imparting dopant, of the same conductivity as the first conductivity-imparting dopant. Sidewall spacers are formed on the gate structures. The P-well region is implanted, in a substantially vertical direction, with a fourth conductivity-imparting dopant, of the same conductivity as the second conductivity-imparting dopant. The N-well region is implanted, in a substantially vertical direction, with a fifth conductivity-imparting dopant, of the same conductivity as the first conductivity-imparting dopant. The silicon substrate is heated to drive in the dopants.

BRIEF DESCRIPTION OF THE DRAWINGS

FIG. 1 is a cross-sectional representation of a prior art lightly doped drain (LDD) device.

FIGS. 2 through 9 are cross-sectional representations of the improved method and resultant structure of the invention for forming sub-micron MOS devices.

DESCRIPTION OF THE PREFERRED EMBODIMENTS

Figure 4:
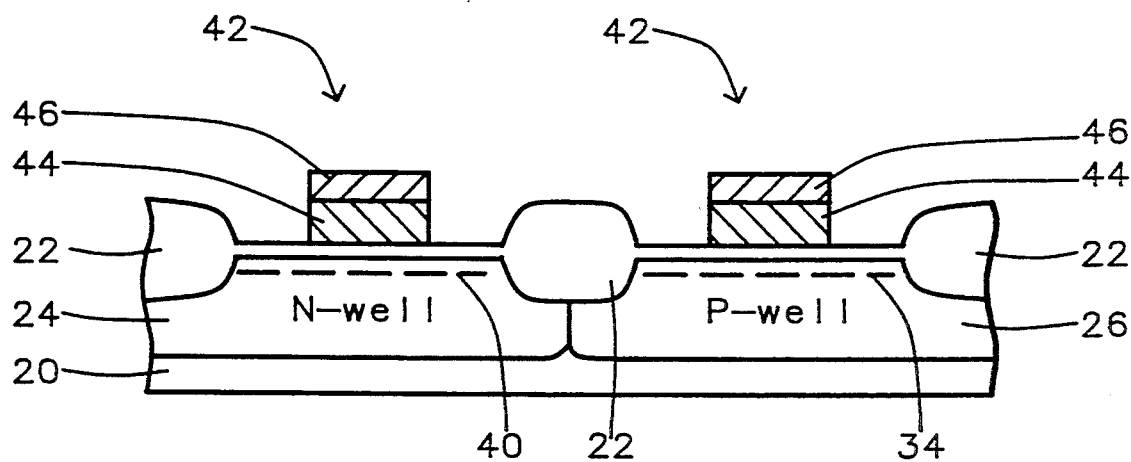

Referring now to FIG. 2, there is shown a silicon substrate 20 in which field isolation regions 22 have been formed previously, and which serve to separate active regions of the device from one another. N-well region 24 and P-well region 26 have been formed in the substrate, and will be the locations for the formation of a PMOS and NMOS device, respectively. A thin oxide layer 28 has been formed on the surface of the substrate for the purpose of avoiding the Kooi effect, caused by nitride removal after the field oxide formation and which reduces implant damage. Before growing the gate oxide, the thin oxide 28 will be removed. The formation of these structures is well understood by those familiar with the art, and details will not be given here, as they are not critical to the invention.

A photoresist layer 30 is deposited and patterned by conventional lithography and etching. It is patterned to expose the P-well, so that a conductivity-imparting dopant 34 may be implanted into the P-well to prevent punchthrough in the to-be-formed NMOS device. The implant is performed by ion implantation 32 of boron B11 at a concentration of between about 1 E 12 and 5 E 12 atoms/cm$^2$ and at an energy of between about 60 and 80 KeV. This implant prevents punchthrough because if the dopant concentration of the region under the channel is not high enough, increasing the drain voltage, the depletion width under the channel will be very long. If the depletion region is close to or reaches the source, punchthrough occurs by the inducement of large leakage current. The anti-punchthrough implant increases the dopant concentration to prevent this.

Referring now to FIG. 3, the photoresist 30 is removed, and a second anti-punchthrough implant is performed, in N-well region 24, to prevent punchthrough in the to-be-formed PMOS device. A photoresist layer 36 is deposited and patterned by conventional lithography and etching. It is patterned to expose the N-well, so that a conductivity-imparting dopant 40 may be implanted. The implant is performed by ion implantation 38 of phosphorus P31 at a concentration of between about 5 E 11 and 5 E 12 atoms/cm$^2$ and at an energy of between about 150 and 180 KeV.

With reference to FIG. 4, gate elements 42 are formed over the N-well and P-well regions. This is accomplished by first conformally depositing a polysilicon 44 layer over the substrate by LPCVD (Low Pressure Chemical Vapor Deposition) to a thickness of between about 1000 and 2500 Angstroms. A silicide 46 layer of, for instance, tungsten silicide (WSi$_6$) is subsequently deposited by LPCVD (Low Pressure Chemical Vapor Deposition) over the polysilicon to a thickness of between about 1500 and 2000 Angstroms. These two layers are then patterned by conventional lithography and etching to form gate elements 42.

Figure 5:
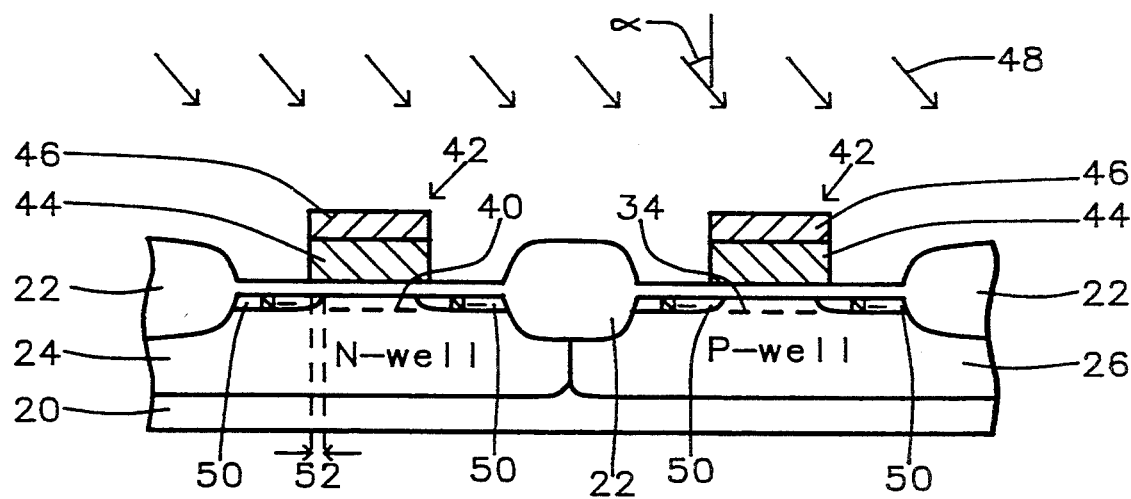

Referring now to FIG. 5, a critical step of the invention will be described. In the prior art, the lightly doped drain regions (e.g., region 14 of FIG. 1) of a PMOS/NMOS structure are formed by two vertical implants, along with two masking steps. The N-LDD would be formed by masking the N-well region, followed by a vertical implant into the P-well of phosphorus P31. The N-well mask would be removed, and then the P-LDD would be formed by masking the P-well, followed by a vertical implant into the N-well of boron fluoride (BF$_2$), followed by removal of the P-well mask.

In the method of the invention, these steps are replaced by a single, large-angle maskless N-LDD implant with wafer rotation. An ion implantation 48 of phosphorus P31 is performed at a concentration of between about 2 E 13 and 3 E 13 atoms/cm$^2$ and at an energy of between about 50 and 70 KeV. This implantation is performed by tilting the wafer at an angle of between about 15 and 45 degrees and rotating the wafer to insure uniform distribution of the dopant. This results in the formation of N— regions 50, which underlap the gate 42 by a distance 52 of between about 500 and 1000 Angstroms.

Figure 6:
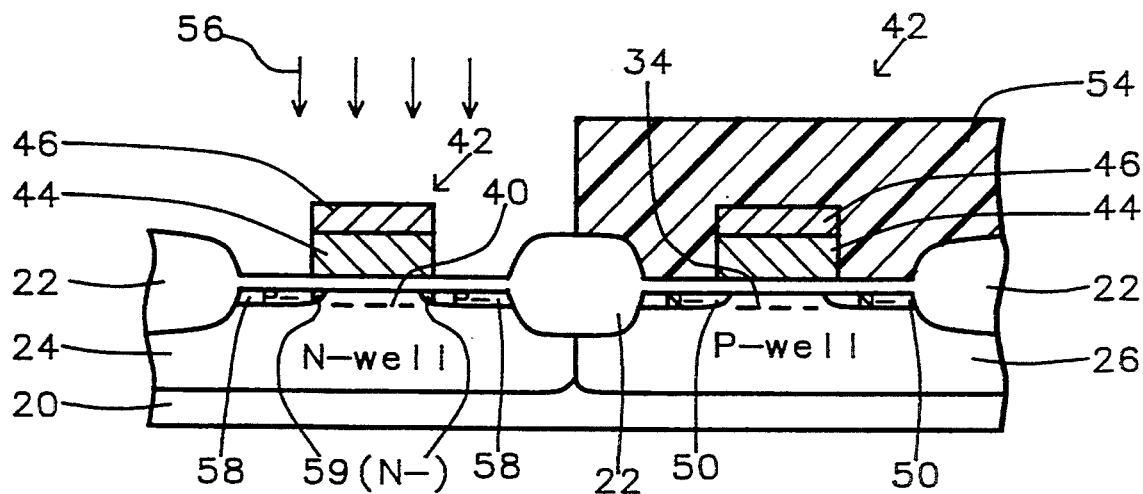

As shown in FIG. 6, a vertical ion implantation 56 is performed in N-well region 24, to form P— regions 58. The implant dosage is increased over what would typically be used in order to overcome the N— implant of the previous step. A photoresist layer 54 is deposited and patterned by conventional lithography to expose the N-well. The implant is performed by ion implantation 56 of BF$_2$ at a concentration of between about 1 E 13 and 5 E 13 atoms/cm$^2$ and at an energy of between about 50 and 80 KeV. N— regions 59 remain under the gate 42 in the N-well.

Figure 7:
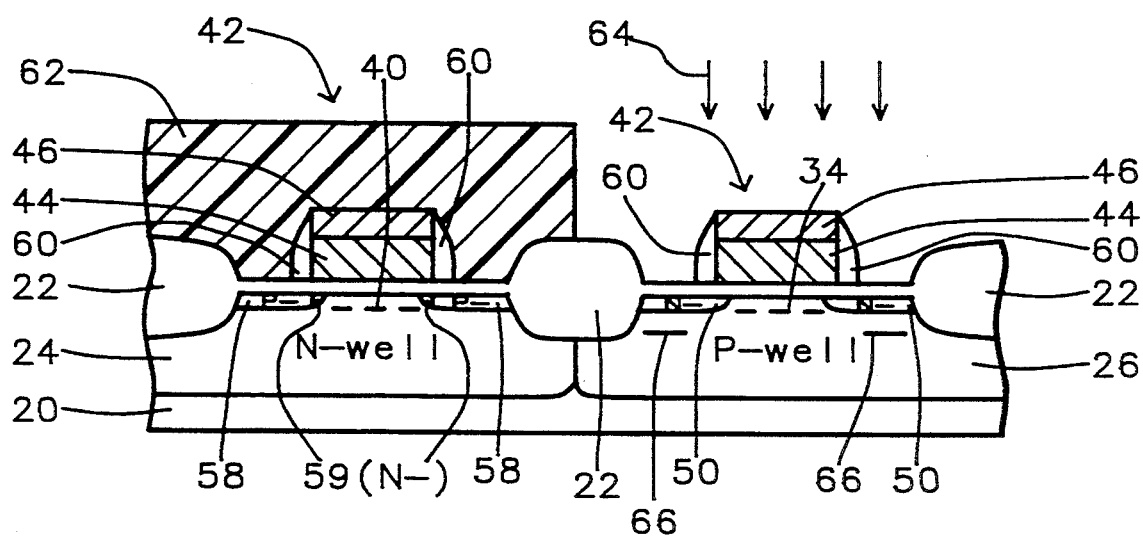

Referring now to FIG. 7, an oxide layer has been formed by APCVD (Atmospheric Pressure Chemical Vapor Deposition) to a thickness of between about 1000 and 2500 Angstroms and then anisotropically etched to form sidewall spacers 60 along the vertical walls of the gate elements 42. A photoresist layer 62 is deposited and patterned by conventional lithography to expose the P-well, so that a conductivity-imparting dopant 66 may be implanted into the P-well to form the heavily doped source/drain regions of the NMOS device. The implant is performed by a vertical ion implantation 64 of arsenic AS75 at a concentration of between about 2 E 15 and 5 E 15 atoms/cm$^2$ and at an energy of between about 60 and 100 KeV.

Figure 8:
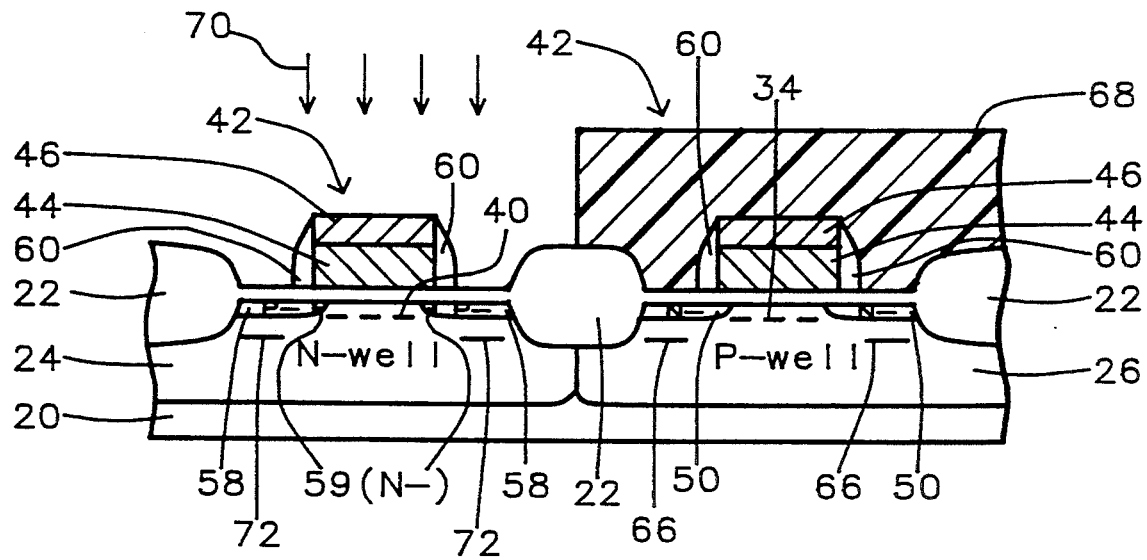

A similar implant is performed, as shown in FIG. 8, to form the heavily-doped source/drain regions for the PMOS device. A photoresist layer 68 is deposited and patterned by conventional lithography to expose the N-well, so that a conductivity-imparting dopant 72 may be implanted into the N-well to form the heavily doped source/drain regions of the PMOS device. The implant is performed by a vertical ion implantation 70 of boron fluoride BF$_2$ at a concentration of between about 1 E 15 and 3 E 15 atoms/cm$^2$ and at an energy of between about 50 and 100 KeV.

Figure 9:
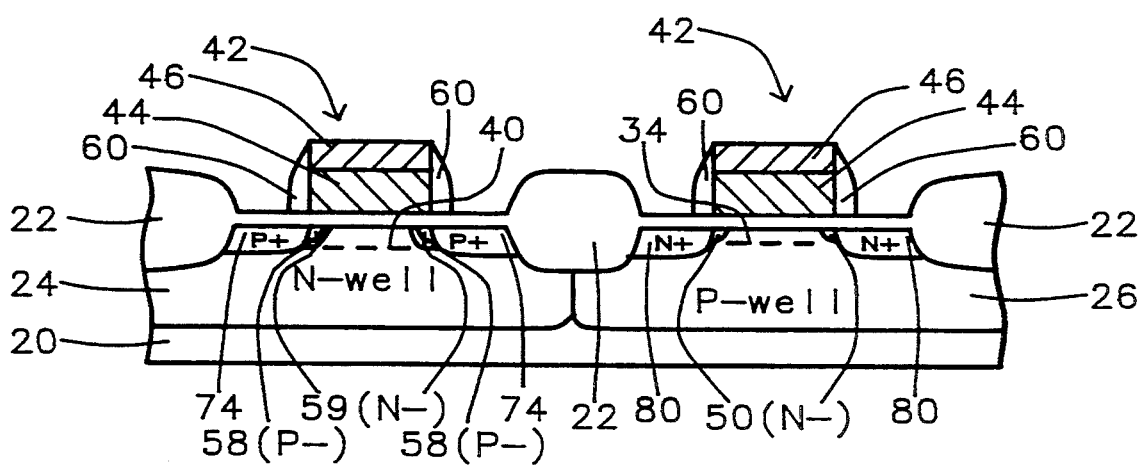

The final step is a drive-in, with the resultant structure as shown in FIG. 9. The wafer is heated to between about 850° and 900° C. for between about 10 and 30 minutes. The result is a Halo structure for the PMOS device and a LATID structure for the NMOS device. The Halo structure consists of the heavily doped P+ regions 74, P— regions 58 and N— regions 59. The remaining N— region 59 increases the threshold voltage $V_T$ of the PMOS, since it increases the doping under the gate. If the N— and P— dose/energy are optimized the $V_T$ increase is limited to about 0.1 volt, which does not have a substantial effect on device performance. The Halo structure has the advantages of increasing the punchthrough voltage of the short-channel device, and suppressing the short-channel threshold voltage falloff.

The resultant LATID structure of the NMOS device consists of heavily doped N+ regions 80 and N— regions 50, wherein the LATID structure provides excellent hot-carrier behavior.

The above method saves a mask step as compared to the prior art, and is thus more easily manufactured, since only one mask step (rather than two) is used to form both the N-LDD and P-LDD structures In an alternate embodiment, which is preferred, the anti-punchthrough implant in the N-well, shown in FIG. 3, is not performed. This eliminates an additional mask step and an implant step, further improving manufacturability. Another benefit of this preferred embodiment is that the PMOS threshold voltage $V_T$ is reduced, improving circuit performance and which enhances operation in a circuit with a low $V_{CC}$.

While the invention has been particularly shown and described with reference to the preferred embodiments thereof, it will be understood by those skilled in the art that various changes in form and details may be made without departing from the spirit and scope of the invention. For instance, the NMOS and PMOS devices described may be connected together such that they form a CMOS (Complmentary MOS) device.

What is claimed is:

1. A method of forming metal oxide semiconductor (MOS) devices, comprising the steps of:
   providing a silicon substrate with field isolation regions, P-well and N-well regions, and an oxide layer over said P-well and N-well regions;
   implanting, in a substantially vertical direction, said P-well region with a first conductivity-imparting dopant;
   forming gate structures over said P-well and N-well regions;
   implanting, at a large angle to the plane of said silicon substrate, a second conductivity-imparting dopant that is of opposite conductivity to said first conductivity-imparting dopant, into said P-well and N-well regions, masked by said gate structures;
   implanting, in a substantially vertical direction, said N-well region with a third conductivity-imparting dopant, of same conductivity as said first conductivity-imparting dopant;
   forming sidewall spacers on said gate structures;
   implanting, in a substantially vertical direction, said P-well region with a fourth conductivity-imparting dopant, of same conductivity as said second conductivity-imparting dopant;
   implanting, in a substantially vertical direction, said N-well region with a fifth conductivity-imparting dopant, of same conductivity as said first conductivity-imparting dopant; and
   heating said silicon substrate to drive in said dopants.

2. The method of claim 1 wherein said large angle is between about 15 and 45 degrees.

3. The method of claim 1 wherein the feature size of said MOS devices is less than about 1.0 micrometers.

4. The method of claim 1 wherein said first conductivity-imparting dopant is boron B11, implanted at a concentration of between about 1 E 12 and 5 E 12 atoms/cm$^2$ and an energy of between about 60 and 80 KeV.

5. The method of claim 1 wherein said second conductivity-imparting dopant is phosphorus P31, implanted at a concentration of between about 2 E 13 and 3 E 13 atoms/cm$^2$ and an energy of between about 50 and 70 KeV.

6. The method of claim 1 wherein said third conductivity-imparting dopant is boron fluoride BF$_2$, implanted at a concentration of between about 1 E 13 and 5 E 13 atoms/cm$^2$ and an energy of between about 50 and 80 KeV.

7. The method of claim 1 wherein said fourth conductivity-imparting dopant is arsenic AS75, implanted at a concentration of between about 2 E 15 and 5 E 15 atoms/cm$^2$ and an energy of between about 60 and 100 KeV.

8. The method of claim 1 wherein said fifth conductivity-imparting dopant is boron fluoride BF$_2$, implanted at a concentration of between about 1 E 15 and 3 E 15 atoms/cm$^2$ and an energy of between about 50 and 100 KeV.

9. The method of claim 1 further comprising the step of implanting, in a substantially vertical direction, said N-well region with a sixth conductivity-imparting dopant, after implanting said first conductivity-imparting dopant.

10. The method of claim 9 wherein said sixth conductivity-imparting dopant is phosphorus P31, implanted at a concentration of between about 5 E 11 and 5 E 12 atoms/cm$^2$ and an energy of between about 150 and 180 KeV.

11. A method of forming metal oxide semiconductor (MOS) devices, comprising the steps of:
    providing a silicon substrate with field isolation regions, P-well and N-well regions, and an oxide layer over said P-well and N-well regions;
    implanting, in a substantially vertical direction, said P-well region with a first conductivity-imparting dopant;
    forming gate structures over said P-well and N-well regions;
    implanting, at an angle to the plane of said silicon substrate of between about 15 and 45 degrees, a second conductivity-imparting dopant that is of opposite conductivity to said first conductivity-imparting dopant, into said P-well and N-well regions, partially masked by said gate structures, wherein said second conductivity-imparting dopant is phosphorus P31, implanted at a concentration of between about 2 E 13 and 3 E 13 atoms/cm$^2$ and an energy of between about 50 and 70 KeV;
    implanting, in a substantially vertical direction, said N-well region with a third conductivity-imparting dopant, of same conductivity as said first conductivity-imparting dopant;
    forming sidewall spacers on said gate structures;
    implanting, in a substantially vertical direction, said P-well region with a fourth conductivity-imparting dopant, of same conductivity as said second conductivity-imparting dopant;
    implanting, in a substantially vertical direction, said N-well region with a fifth conductivity-imparting dopant, of same conductivity as said first conductivity-imparting dopant; and
    heating said silicon substrate to drive in said dopants.

12. The method of claim 11 wherein the feature size of said MOS devices is less than about 1.0 micrometers.

13. The method of claim 11 wherein said first conductivity-imparting dopant is boron B11, implanted at a concentration of between about 1 E 12 and 5 E 12 atoms/cm$^2$ and an energy of between about 60 and 80 KeV.

14. The method of claim 11 wherein said third conductivity-imparting dopant is boron fluoride BF$_2$, implanted at a concentration of between about 1 E 13 and 5 E 13 atoms/cm$^2$ and an energy of between about 50 and 80 KeV.

15. The method of claim 11 wherein said fourth conductivity-imparting dopant is arsenic AS75, implanted at a concentration of between about 2 E 15 and 5 E 15 atoms/cm$^2$ and an energy of between about 60 and 100 KeV.

16. The method of claim 11 wherein said fifth conductivity-imparting dopant is boron fluoride BF$_2$, implanted at a concentration of between about 1 E 15 and 3 E 15 atoms/cm² and an energy of between about 50 and 100 KeV.

17. The method of claim 11 further comprising the step of implanting, in a substantially vertical direction, said N-well region with a sixth conductivity-imparting dopant, after implanting said first conductivity-imparting dopant.

18. The method of claim 17 wherein said sixth conductivity-imparting dopant is phosphorus P31, implanted at a concentration of between about 5 E 11 and 5 E 12 atoms/cm² and an energy of between about 150 and 180 KeV.

* * * * *